United States Patent [19]
Wenham et al.

[11] Patent Number: 5,797,998
[45] Date of Patent: Aug. 25, 1998

[54] MULTIPLE LAYER THIN FILM SOLAR CELLS WITH BURIED CONTACTS

[75] Inventors: Stuart Ross Wenham, Menai; Martin Andrew Green, Waverley, both of Australia

[73] Assignee: Pacific Solar Pty. Limited, New South Wales, Australia

[21] Appl. No.: 700,544

[22] PCT Filed: Mar. 31, 1995

[86] PCT No.: PCT/AU95/00184

§ 371 Date: Aug. 28, 1996

§ 102(e) Date: Aug. 28, 1996

[87] PCT Pub. No.: WO95/27314

PCT Pub. Date: Oct. 12, 1995

[30] Foreign Application Priority Data

Mar. 31, 1994 [AU] Australia .............. PM4834

[51] Int. Cl.⁶ .............................................. H01L 31/05
[52] U.S. Cl. .................. 136/255; 257/465; 438/57; 438/95
[58] Field of Search ............... 136/255; 257/458, 257/465; 438/57, 98

[56] References Cited

U.S. PATENT DOCUMENTS

| | | | |
|---|---|---|---|
| 3,994,012 | 11/1976 | Warner, Jr. | 136/246 |
| 4,140,610 | 2/1979 | Morimoto | 437/2 |
| 4,206,002 | 6/1980 | Sabnis et al. | 136/249 MS |
| 4,376,228 | 3/1983 | Fan et al. | 136/255 |
| 4,409,422 | 10/1983 | Sater | 136/244 |
| 4,891,074 | 1/1990 | Oushinsky et al. | 136/249 |
| 5,595,607 | 1/1997 | Wenham et al. | 136/244 |

FOREIGN PATENT DOCUMENTS

| | | | |
|---|---|---|---|
| 85701/75 | 4/1977 | Australia | 136/255 |
| 0179556A2 | 4/1986 | European Pat. Off. | 136/256 |
| 0509215A1 | 10/1992 | European Pat. Off. | 136/249 TJ |
| 2390014 | 1/1979 | France | 136/255 |
| 93/12543 | 6/1993 | WIPO | 136/244 |

*Primary Examiner*—Nam Nguyen
*Attorney, Agent, or Firm*—Jordan and Hamburg

[57] ABSTRACT

A multilayer solar cell structure includes a stack of alternating p-type and n-type semiconductor layers arranged to form a plurality of rectifying photovoltaic junctions. Low-cost cells are manufactured from low-quality material which is optimized by employing very high doping levels in thin layers. Typically, the doping levels are greater than $10^{17}$ atoms/cm³, and the thickness of the layers is related to carrier diffusion length in thickness. Contact is made to underlying layers by way of a buried contact structure comprising grooves extending down through all of the active layers, the walls of each groove being doped with n- or p-type impurities depending upon the layers to which the respective contact is to be connected and the grooves being filled or partly filled with metal contact material.

18 Claims, 4 Drawing Sheets

MULTIPLE LAYER THIN FILM SOLAR CELLS WITH BURIED CONTACTS

BACKGROUND OF THE INVENTION

The present invention relates generally to the field of solar cell technology and in particular to improvements in thin film devices.

The Buried Contact Solar Cell, the subject of earlier U.S. Pat. Nos. 4,726,850 and 4,748,130, has been widely used by photovoltaic manufacturers for implementation with thick substrate (greater than 120 microns) devices.

The present invention is associated with a new solar cell structure and its implementation, whereby multiple interleaved n and p-type silicon horizontal layers are used to greatly increase the collection probability for carriers generated by the absorption of light in poor quality material. Such structures are not feasible with conventional approaches where bulk substrates are formed from ingots which are subsequently sawn into the individual wafers or substrates. However, new thin film approaches for layer formation such as chemical vapour deposition, solution growth, liquid phase epitaxy, plasma deposition and recrystallization or plasma deposition of amorphous material and subsequent crystallization, etc., make it feasible to form structures comprising multiple horizontal layers of interleaved n- and p-type material. Furthermore, prior to another recent invention by the present inventors, entitled "Buried Contact Interconnected Thin Film and Bulk Photovoltaic Cells" U.S. Pat. No. 5,595,607 (PCT/AU92/00658), such a structure would never have been considered as suitable for photovoltaic device fabrication, due to the difficulty in contacting all the layers of a given polarity which need to be connected in parallel. In the invention described in U.S. Pat. No. 5,595,607 PCT/AU92/00658, the Buried Contact Solar Cell approach is used to provide grooves through the entire thickness of all the horizontal doped silicon layers to enable contact to be made to each respective layer of the appropriate polarity by using the corresponding dopant type to heavily diffuse the groove walls as shown in FIG. 1. These grooves can be of any dimension provided they are deep enough to contact all the active silicon layers, and narrow enough to avoid excessive losses due to the reduction in useful surface area, where light falling on the contact area is prevented from entering the silicon material.

SUMMARY OF THE INVENTION

The present invention consists in a solar cell having at least three layers of alternate polarity material defining p-n junctions between each pair of alternate layers, the at least three layers having a maximum dopant concentration above $10^{17}$ atoms/cm$^3$, and the at least three layers having a thickness which is not substantially greater than a minority carrier diffusion length for the dopant concentration of the material in the respective layer.

Typically the thickness of the doped layers will be in the range of 0.05 times to 5 times the minority carrier diffusion length and preferably in the range of 0.2 to 2 times the minority carrier diffusion length for the respective doped material. A device with a spatially non-uniform diffusion length and/or thickness will fall within the scope of this invention if any region of the layers falls within the above ranges. A demonstratable measure of these condition being satisfied would be the achievement of high average collection probabilities for carriers.

Cells may be of doped single crystalline or polycrystalline silicon, amorphous silicon and its alloys, cadmium telluride, cadmium sulphide, copper indium diselenide, an alloy of the form $CuIn_xGa_{1-x}S_ySe_{1-y}$ or other semiconductor material. In cells comprising a stack of silicon layers, one or more relatively thin layers of silicon/germanium alloy could also be included. Layers of insulating material such as silicon oxide, nitride or oxy-nitride could also be intermittently interleaved within the stack.

Embodiments of the invention may also include layers of intrinsic material or lightly doped material between pairs of alternate polarity layers, such that the junctions are p-Intrinsic-n junctions.

In embodiments based upon silicon material, typically maximum dopant concentrations within the majority of layers of $10^{17}$ atoms/cm$^3$ or more are used, with doped layer thicknesses within the range of 50 Å to 50 µm, depending upon the material quality. In silicon material the dopant concentration will preferably be greater than $10^{17}$ atoms/cm$^3$ over at least 50% of the bulk of each layer and more preferably range between $10^{17}$ and $10^{18}$ atoms/cm$^3$ over substantially all of each layer.

In preferred embodiments using silicon material each layer is between 0.2 and 15 microns thick.

In silicon cells the top layer preferably has a maximum dopant concentration within the layer of $10^{18}$ atoms/cm$^3$ or greater.

According to a second aspect, the present invention includes a method of forming a thin film solar cell comprising the steps of (a) forming onto a substrate a plurality of alterately doped thin layers of semiconductor material to form a plurality of rectifying junctions therebetween, the maximum dopant concentration of each layer being greater than $10^{17}$ atoms/cm$^3$, and each layer having a thickness not substantially greater than the minority carrier diffusion length of the respective doped material, (b) forming sequentially at least two sets of grooves in the plurality of layers to expose some or all of the doped layers, (c) forming in at least one of the grooves a p-type surface region over the entire surface of the groove or grooves, (d) forming in at least one other of the grooves an n-type surface region over the entire surface of the respective groove or grooves, (e) forming a metal contact in each of the grooves respectively to make contact with the p-type and n-type surface regions.

Preferably the substrate is selected from one of: single crystalline, polycrystalline or amorphous silicon, graphite, steel or other metals, ceramic or glass and the active layers are formed by a process or processes which may be selected from chemical vapor deposition, solution growth, liquid phase epitaxy, and plasma deposition of an amorphous film followed by crystallization.

In a further embodiment, the method includes the steps of forming intrinsic or lightly doped layers between each pair of p and n-type layers and/or forming insulating layers within the stack.

BRIEF DESCRIPTION OF THE DRAWINGS

Embodiments of the invention will now be described with reference to the accompanying drawings in which.

5,797,998

3

Figure 1:
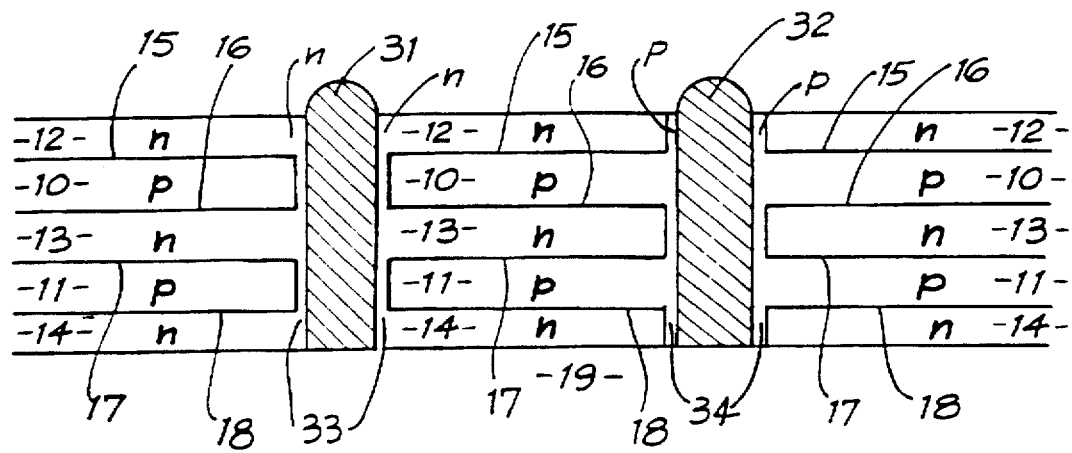
FIG. 1 illustrates a basic structure of a solar cell according to the present invention, having multiple interleaved n and p-type doped single crystalline or polycrystalline silicon layers, using buried contacts to make contact to buried layers.
Figure 2:
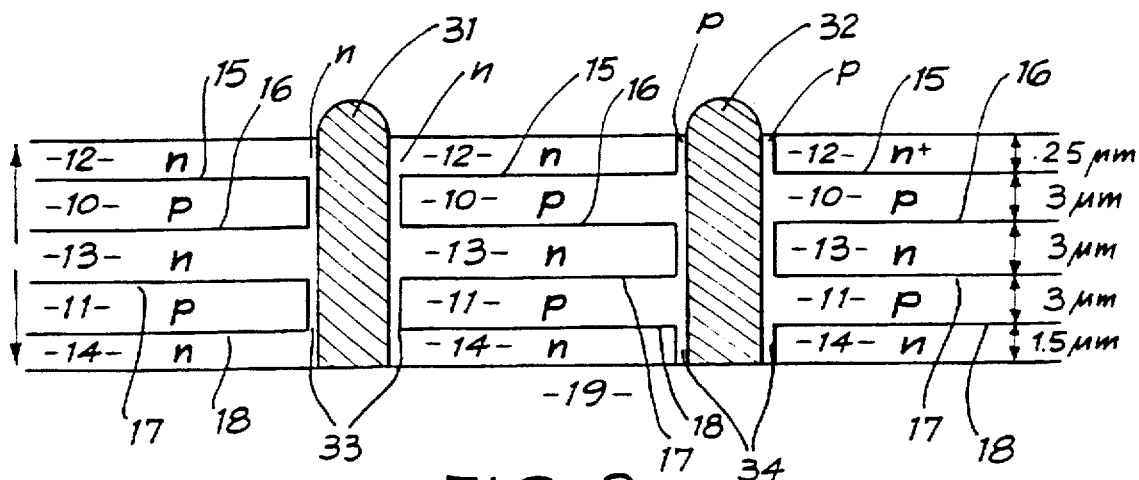
Figure 3:
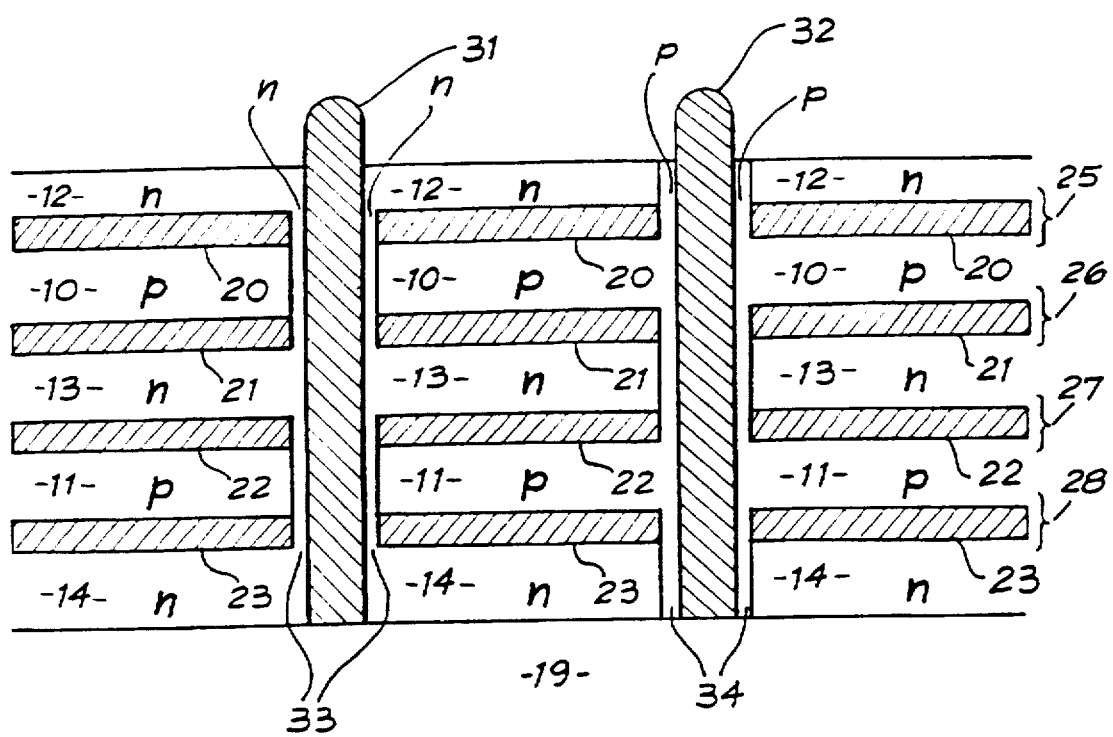
Figure 4:
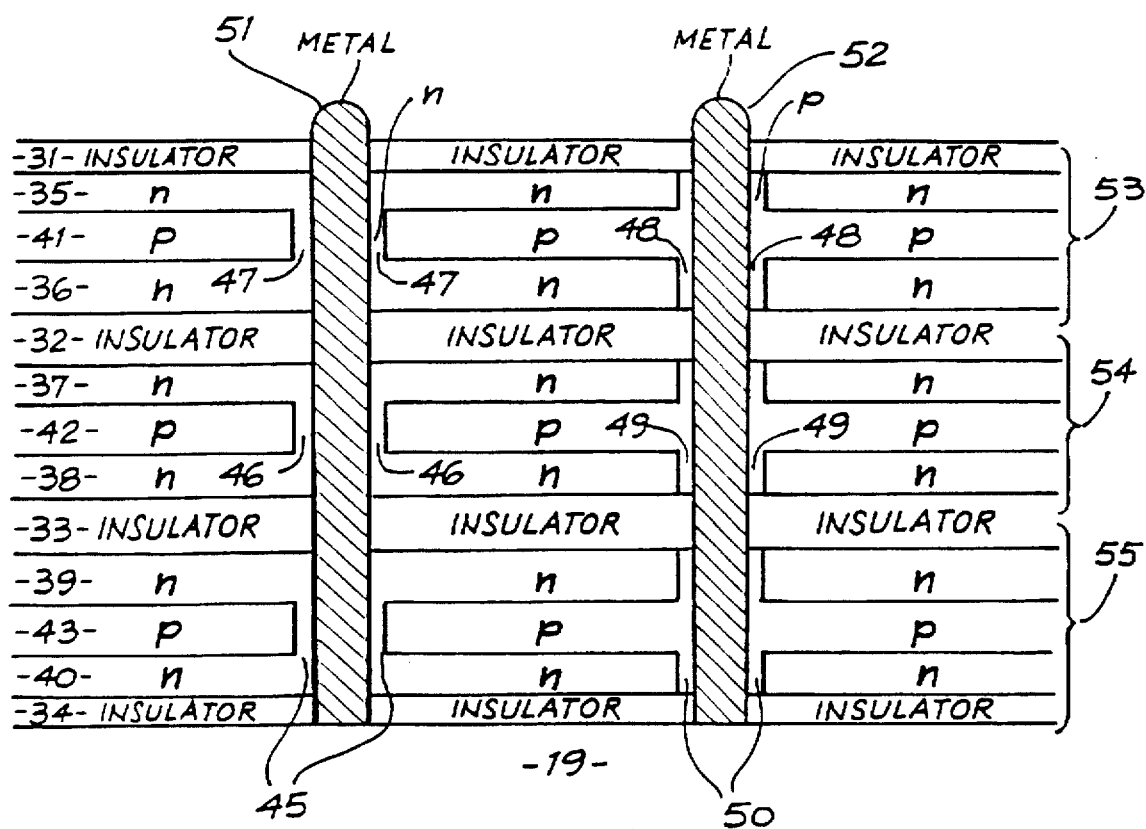
Figure 5:
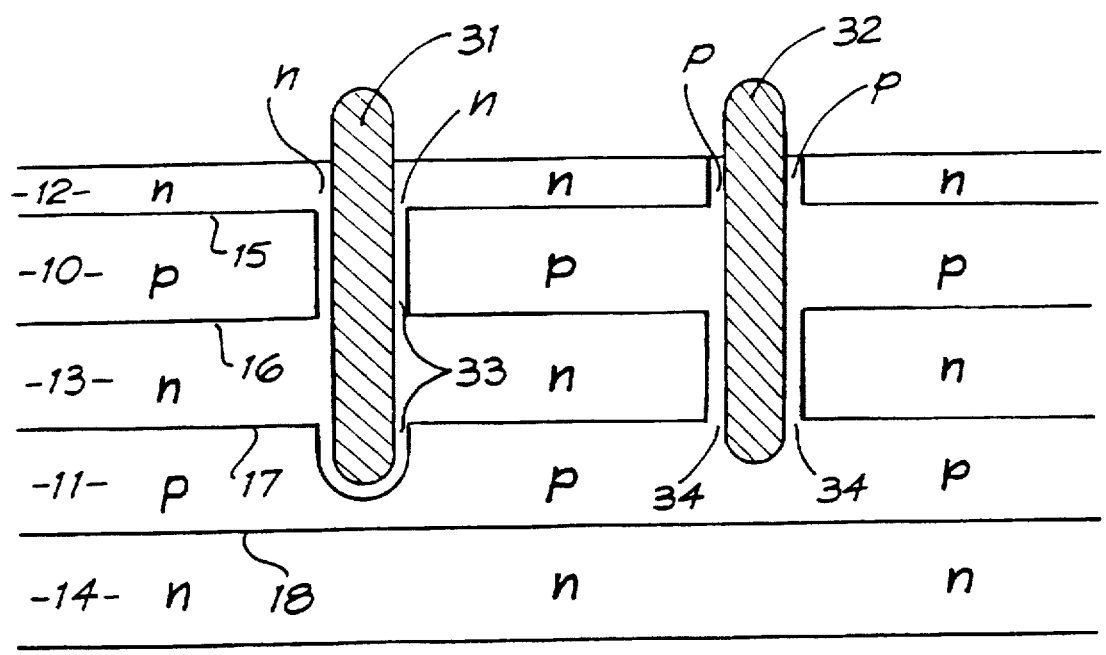

FIG. 2 illustrates the same solar cell structure as that of FIG. 1 but with dimensions given for an embodiment using a poor quality silicon material;

FIG. 3 illustrates a further embodiment of the invention having a similar structure to that of FIGS. 1 and 2 but where intrinsic layers are interposed between alternate p and n-type layers;

FIG. 4 illustrates a further embodiment of the invention having a similar structure to that of FIGS. 1 and 2 but where insulating layers are interposed between semiconductor layers; and FIG. 5 illustrates a further embodiment of the invention having a similar structure to that of FIGS. 1 and 2 but where the metal contacts do not contact all layers.

DETAILED DESCRIPTION OF THE EMBODIMENTS

Referring to FIG. 1, embodiments of the present invention have a structure comprising a plurality of alternate p-type semiconductor layers 10, 11 and n-type semiconductor layers 12, 13, 14 forming rectifying junctions 15, 16, 17, 18 therebetween. The alternating semiconductor layers 10–14 are formed on and supported by a substrate 19 which may be selected from single crystalline, polycrystalline or amorphous silicon, graphite, steel or other metals, ceramic, glass or any other material onto which a thin semiconductor film can be successfully formed. Contacts 31, 32 are formed respectively with the n-type layers 12, 13, 14 and the p-type layers 10, 11 by first forming vertical grooves to expose all of the layers of active semiconductor material and then, for those contacts which are connecting n-type regions, forming a vertical n-type doped layer 33 which connects with all of the n-type layers 12, 13, 14 and establishes a junction with all of the p-type layers 10, 11. Similarly, a p-type doped layer 34 is formed in the groove for the contact connecting the p-type layers 10, 11, the vertical p-type layer 34 establishing a junction with the exposed n-type layers 12, 13, 14. The metal contacts 31, 32 are then formed within the grooves lined by the n-type and p-type layers 33, 34.

While the embodiment of FIG. 1 is shown as a five layer cell, it will be appreciated that a minimum of three doped layers (i.e., p-n-p or n-p-n) are required to gain the advantage of the invention. While the embodiment of FIG. 1 is shown with the grooves filled with metal, it will be appreciated that partially filled grooves may also be used to good effect.

The active semiconductor layers 10–14 shown in FIG. 1 are thin films which are formed on the substrate 19 by any of a number of known techniques, including chemical vapor deposition, solution growth, liquid phase epitaxy and plasma deposition and recrystallization or plasma deposition of amorphous material and subsequent crystallization, with the dopant being incorporated in each case during or after the layer formation step.

As described above, the present invention provides an improved cell structure which employs a plurality of p and/or n layers and a selection of unusual doping levels and thicknesses for the layers within the stack of doped layers as illustrated in FIG. 1. In order to produce workable cells embodiments of the present invention make use of the contact structure described in PCT/AU92/00658. An important advantage of the present invention, is that the individual layer thicknesses and doping levels are selected to suit the quality of the corresponding silicon material so that most carriers are generated sufficiently close to a junction for collection. This requirement is satisfied by the condition that

4 the minority carrier diffusion lengths over most of the device area are at least comparable and preferably greater than the respective layer thicknesses. This enables the achievement of high collection probabilities and hence high internal quantum efficiencies throughout the total device thickness, and for all wavelengths of light respectively. This invention enables the achievement of high efficiency devices, even from very poor quality, low cost silicon material which characteristically has short diffusion lengths. The described strategy ensures that, in conjunction with moderate to high levels of light trapping, high generated currents can be achieved. With regard to voltage, it is necessary with short diffusion length silicon material, to reduce the dark saturation current of the total device, by increasing the doping concentrations, and/or reducing the material volume, to enable suitably high open circuit voltages to be achieved. With conventional device structures, this is not possible while simultaneously achieving high cell efficiencies. In the present invention, however, much higher concentrations of dopants are incorporated into the horizontal layers, without having adverse effects on the current generating capability of the device. Normally, with conventional structures, the diffusion lengths of the material fall considerably as the doping concentration is increased. If, however, poor quality silicon material is already being used, relatively little degradation in the diffusion lengths is experienced as the doping concentration is increased. The corresponding benefit is that the dark saturation current falls approximately inversely proportionately with doping concentration, therefore enabling the achievement of much higher voltages than would normally be expected from such poor quality materials. In combination, therefore, both high current and high voltages can be achieved with low quality material, provided the dimensions of the horizontal layer thicknesses are chosen to be appropriate for the diffusion lengths of the silicon material used.

To illustrate the effectiveness of the invention, the device structure of FIG. 1 has been modelled using commercially available computer modelling packages, with the layer dimensions as shown in FIG. 2. For this example, each layer received a doping concentration of $1 \times 10^{18}$ atoms per cubic centimeter but with the rear surface much more heavily doped so as to ensure the electronic performance of the device is insensitive to the rear surface recombination velocity. Furthermore, in the modelled example, the top n-type layer received a surface doping concentration of $1 \times 10^{20}$ atoms/cm$^3$, with a corresponding sheet resistivity of 80 $\Omega/\square$. In conjunction, the top surface recombination velocity of 10,000 cm/s was assumed to ensure a good device response to the short wavelengths of light that are absorbed very close to the top surface. Other modelling parameters for the given example included a 5% loss due to surface and metal reflection, similar to that demonstrated by the conventional buried contact solar cells.

The resulting performance predictions using the present invention in conjunction with the modelling parameters given above, indicate that efficiencies in excess of 16% are relatively easily achieved even with relatively poor light trapping and very short minority carrier lifetimes (less than 100 nanoseconds). These predicted efficiencies rapidly increase towards 20% with the inclusion of moderate levels of light trapping while still retaining the very poor single crystalline or polycrystalline silicon material properties.

Another advantage of the multiple interleaved n-type and p-type layers is that they provide multiple parallel paths for current conduction between contact points, reducing resistive losses. If the width of each layer is chosen according to previous guidelines so that it is less than a diffusion length, sharing of current between the layers will automatically occur by carrier injection between layers. This process has not been exploited in solar cell designs of the past. As a result, top surface doping profiles and sheet resistivities can be optimized for current collection and dark saturation current minimization with some degree of independence from lateral resistive losses in the resulting layer.

Another strength of the approach is its tolerance to grain boundaries parallel to the top surface of the cell. In normal cell structures, these can be disastrous since any carriers generated on the side of this boundary away from the junction have little chance of being collected. In the present structure, such isolation from a junction would not occur except for cases where there were two such grain boundaries within a layer and even in this case, the only inactive device volume would be that directly between the two grain boundaries.

Grain boundary tolerance, in general, could be further improved by standard techniques such as hydrogenation, oxidation, selective etching, etc.

Referring now to FIG. 3, a further embodiment of the invention is shown in which the quality of junctions between the doped layers of the stack is improved by the addition of lightly doped or intrinsic regions 20, 21, 22, 23 inserted between each layer of opposite doping polarity. These intermediate layers 20–23 are formed in some sequences merely by cutting off the supply of dopants during layer deposition or by compensating the two dopant types. The desired thickness of these layers will depend on material quality but could vary from very thin layers formed by compensation to a micron or more in thickness. This structure results in the formation of p-I-n junctions (p-Intrinsic-n junctions) 25, 26, 27, 28 between respective p and n-type layers.

As was mentioned above, the horizontal layers are formed using a range of techniques and approaches, most of which enable the doping of the layers to take place simultaneously during deposition. Following the layer deposition, the grooves are formed by either mechanical, chemical or optical approaches with laser scribing, diamond tip scribing, dicing wheel cutting, the use of photolithography in conjunction with chemical etching, etc., having already been demonstrated for these purposes. Following appropriate groove formation, the groove walls are doped with the appropriate polarity to enable contact to be made to the corresponding horizontal doped silicon layers. The doping of the grooved walls is done by diffusion, deposition of an additional layer, etc. The metal is applied to the grooves by any of electrolytic deposition, solution growth, screen printing, soldering, dipping, etc.

The supporting substrate for the layers is formed from any of many different suitable materials such as single crystalline, polycrystalline or amorphous silicon, graphite, steel or other metals, ceramic, glass, etc.

The material of the layers is selected from any semiconductor or combination of semiconductors. For example, in one possible implementation, relatively thin layers of silicon/germanium alloy could be included into a stack of silicon layers, extending the infrared response of the device without appreciable loss of voltage output. Other materials such as amorphous silicon and its alloys, cadmium telluride, cadmium sulphide, copper indium diselenide or alloys of the form $CuIn_xGa_{1-x}S_ySe_{1-y}$ could also be used. Insulation layers such as silicon oxide, nitride or oxy-nitride could also be interleaved within the stack. This might have some practical advantages during growth by resetting growth conditions for layers grown subsequently to oxide deposition as well as giving scope for optimizing optical design by reflection from such layers due to refractive index mismatch.

Referring to FIG. 4, an embodiment is illustrated in which layers of insulating material 31–34 are inserted into a stack of doped layers 35–40. The stack comprises a plurality of sub-stacks 53, 54, 55 each comprising three doped layers 35, 41, 36 etc. configured as an n-p-n stack of layers. Connection is made as with the earlier described embodiment by forming at least two grooves in the stack and forming n-type vertical surface layers 45, 46, 47 and p-type vertical surface layers 48, 49, 50 in respective grooves before adding metal contacts 51, 52, by electroless plating, for example. It will be recognised that other stack configurations would be possible, such as including a number of layers other than three in each sub-stack.

The structure of FIG. 4 has the advantage that in the event of an imperfection occurring in a layer or layers of a cell during manufacture that would otherwise cause overlying layers to fail or perform below expectation the placement of a layer of insulating material over the imperfection will have the effect of "resetting" the structure such that layers above the layer of insulating material will be unaffected by the imperfection.

Referring now to FIG. 5, a structure is shown which is similar to that of FIGS. 1 and 2 but where not all of the layers 10, 11, 12, 13, 14 are contacted by the contacts 31, 32 via the vertical doped layers 33, 34. The advantage of the structure of FIG. 5 is that non-contacted layer 14 is isolated from the rest of the cell structure by intervening p-n junctions. This is an important feature when the layers deposited onto the substrate are initially of poor quality, but the quality improves as successive layers are deposited. By not contacting the layer or layers near the substrate, these are rendered inactive if sufficiently thick and do not degrade the cell performance to the same extent as would occur if contact was made.

A process which can be used for the manufacture of the cell structure of FIG. 2 could have the following process steps:

1. Prepare substrate onto which the cell is to be deposited.

2. Deposit an n-type silicon layer by Chemical Vapor Deposition (CVD).

3. Deposit a p-type silicon layer over the previous layer by CVD.

4. Deposit an n-type silicon layer over the previous layer by CVD.

5. Deposit a p-type silicon layer over the previous layer by CVD.

6. Deposit an n-type silicon layer over the previous layer by CVD.

7. Apply a masking/surface passivating layer.

8. Form a first set of grooves by either laser or mechanical scribing followed by groove cleaning.

9. Form an n-type doped layer on the walls of first groove by diffusion or CVD.

10. Apply a masking layer to wall surfaces of the first groove.

11. Form a second set of grooves followed by groove cleaning.

12. Form a p-type doped layer on the walls of the second groove by diffusion or CVD.

13. Chemically etch to expose silicon in the grooves.

14. Electroless plating of nickel to contact silicon in the grooves.

15. Sintering of nickel.

16. Apply copper conductors by electroless plating of copper over the nickel.

17. Deposit silver capping layer over the copper.

In the event that amorphous silicon is deposited in steps 2–6 then an additional crystallization step may be required, preferably after step 7.

Although drawings are shown for flat interfaces, in practice these could be structured or textured to improve light trapping in cell.

It will be appreciated by those skilled in the art, that variations in the above with respect to material selection, fabrication techniques, and structure dimensions can be used without departing from the spirit of the invention.

We claim:

1. A thin film polycrystalline solar cell comprising:
    at least three layers of alternate polarity polycrystalline material defining p-n junctions between each pair of alternate polarity layers of said at least three layers of alternate polarity polycrystalline material;
    connecting means for connecting like polarity layers of said at least three layers of alternate polarity polycrystalline material in parallel;
    one of lightly doped and intrinsic regions separating said at least three layers of alternate polarity polycrystalline material;
    the at least three layers of alternate polarity polycrystalline material having a maximum dopant concentration above $10^{17}$ atoms/cm$^3$; and
    each of the at least three layers of alternate polarity polycrystalline material having a thickness which is not greater than 5 times a minority carrier diffusion length for based on a dopant concentration thereof.

2. The solar cell of claim 1 wherein the thicknesses of said at least three layers of alternate polarity polycrystalline material are in a range of 0.05 to 5 times the minority carrier diffusion length for respective ones of said at least three layers of alternate polarity polycrystalline material.

3. The solar cell of claim 1 wherein the thicknesses of said at least three layers of alternate polarity polycrystalline material are in a range of 0.2 to 2 times the minority carrier diffusion length for respective ones of said at least three layers of alternate polarity polycrystalline material.

4. The solar cell of claim 1 wherein the thicknesses of said at least three layers of alternate polarity polycrystalline material are in a range of 50 Å to 50 µm.

5. The solar cell of claim 1 wherein a material of said at least three layers of alternate polarity polycrystalline material is selected from one or more of doped single crystalline or polycrystalline silicon, amorphous silicon and alloys thereof, cadmium telluride, cadmium sulphide, copper indium diselenide and alloys of the form $CuIn_xGa_{1-x}S_ySe_{1-y}$.

6. The solar cell of claim 1 wherein said at least three layers of alternate polarity polycrystalline material includes a stack of silicon layers and layers of silicon/germanium alloy.

7. The solar cell of claim 1 wherein said at least three layers of alternate polarity polycrystalline material includes a stack of silicon layers intermittently interleaved by layers of insulating material.

8. The solar cell of claim 7 wherein the insulating layers are formed of one of silicon oxide, nitride and oxy-nitride.

9. The solar cell of claim 8 wherein the insulating layers are located between groups of 3 or more of said at least three layers of alternate polarity polycrystalline material.

10. The solar cell of claim 1 wherein a material of said at least three layers of alternate polarity polycrystalline material is silicon and the thicknesses of said at least three layers of alternate polarity polycrystalline material are on an order of 40 µm or less.

11. The solar cell of claim 10 wherein a dopant concentration of said at least three layers of alternate polarity polycrystalline material is greater than $10^{17}$ atom/cm$^3$ over at least 50% of a bulk of each of said at least three layers of alternate polarity polycrystalline material.

12. The solar cell of claim 11 wherein a dopant concentration ranges between $10^{17}$ and $10^{18}$ atoms/cm$^3$ over substantially all of each of said at least three layers of alternate polarity polycrystalline material.

13. The solar cell of claim 1 wherein each of said at least three layers of alternate polarity polycrystalline material is between 0.2 and 15 microns thick.

14. The solar cell of claim 1 wherein a top layer of said at least three layers of alternate polarity polycrystalline material has dopant concentration of $10^{18}$ atoms/cm$^3$ or greater.

15. A method of forming a thin film polycrystalline solar cell comprising the steps of:
    (a) forming onto a substrate a plurality of alternately doped thin layers of polycrystalline semiconductor material, separated by one of intrinsic and lightly doped regions, to form a plurality of rectifying junctions between said alternately doped thin layers of polycrystalline semiconductor material, a maximum dopant concentration of at least 3 layers of said alternately doped thin layers of polycrystalline semiconductor material being greater than $10^{17}$ atoms/cm$^3$, and each of said alternately doped thin layers of polycrystalline semiconductor material having a thickness not greater than 5 times a the minority carrier diffusion length thereof;
    (b) forming sequentially at least two sets of grooves in the plurality of said alternately doped thin layers of polycrystalline semiconductor material to expose some or all of the alternately doped thin layers of polycrystalline semiconductor material;
    (c) forming in at least one of the grooves a p-type surface region over an entire surface thereof;
    (d) forming in at least one other of the grooves an n-type surface region over an entire surface thereof; and
    (e) forming a metal contact in each of the grooves respectively to make contact with the p-type and n-type surface regions thereof.

16. The method of claim 15 wherein the substrate is selected from one of single crystalline, polycrystalline and amorphous silicon, graphite, steel and other metals, ceramic, and glass.

17. The method of claim 15 wherein the alternately doped thin layers of polycrystalline semiconductor material are formed by at least one of processes selected from chemical vapour deposition, solution growth, liquid phase epitaxy, plasma deposition and recrystallization and plasma deposition of amorphous material and subsequent crystallization.

18. The method of claim 15 further including the steps of forming at least one insulating layer between at least a group of three of said alternately doped thin layers of polycrystalline semiconductor material.

* * * * *